United States Patent
Chung et al.

(10) Patent No.: US 12,040,762 B2
(45) Date of Patent: Jul. 16, 2024

(54) METHOD FOR PERFORMING NORMALIZATION OF AUDIO SIGNAL AND APPARATUS THEREFOR

(71) Applicant: GAUDIO LAB, INC., Seoul (KR)

(72) Inventors: Hyunjoo Chung, Seoul (KR); Hyunoh Oh, Gyeonggi-do (KR); Sangbae Chon, Seoul (KR); Jeonghun Seo, Seoul (KR)

(73) Assignee: GAUDIO LAB, INC., Seoul (KR)

( * ) Notice: Subject to any disclaimer, the term of this patent is extended or adjusted under 35 U.S.C. 154(b) by 358 days.

(21) Appl. No.: 17/535,329

(22) Filed: Nov. 24, 2021

(65) Prior Publication Data
US 2022/0166397 A1    May 26, 2022

(30) Foreign Application Priority Data

Nov. 24, 2020  (KR) .................. 10-2020-0159371
Nov. 24, 2020  (KR) .................. 10-2020-0159372

(51) Int. Cl.
*H03G 7/00* (2006.01)
*G06F 3/16* (2006.01)
*H03G 9/00* (2006.01)

(52) U.S. Cl.
CPC ............. *H03G 7/007* (2013.01); *G06F 3/165* (2013.01); *H03G 9/005* (2013.01)

(58) Field of Classification Search
CPC .......... H03G 7/007; H03G 9/005; H03G 7/00; G06F 3/165
See application file for complete search history.

(56) References Cited

U.S. PATENT DOCUMENTS

| | | | |
|---|---|---|---|
| 8,433,079 B1 * | 4/2013 | Hipple .................. | H03G 7/002 381/104 |
| 9,559,651 B2 * | 1/2017 | Baumgarte ......... | G10L 21/0316 |
| 10,020,001 B2 * | 7/2018 | Hoerich ................ | H03G 9/005 |
| 11,336,248 B2 * | 5/2022 | Chon .................... | H03G 7/007 |
| 11,379,178 B2 * | 7/2022 | Küch ...................... | H04S 7/30 |

(Continued)

FOREIGN PATENT DOCUMENTS

| | | |
|---|---|---|
| JP | 2020-39181 | 3/2020 |
| KR | 10-2015-0036581 | 4/2015 |

(Continued)

OTHER PUBLICATIONS

International Search Report for PCT/KR2021/017428 mailed on Mar. 8, 2022 and its English machine translation provided by Applicant's foreign counsel.

(Continued)

*Primary Examiner* — Olisa Anwah
(74) *Attorney, Agent, or Firm* — Womble Bond Dickinson (US) LLP

(57) ABSTRACT

A method for performing loudness normalization by an audio signal processing device includes: receiving an audio signal; receiving information relating to integrated loudness of the audio signal; receiving information relating to target loudness of the audio signal; obtaining a corrected integrated loudness by correcting the integrated loudness based on one or more audio processing; and obtaining a normalized audio signal by normalizing the audio signal based on the corrected integrated loudness and the target loudness.

20 Claims, 4 Drawing Sheets

(56) References Cited

U.S. PATENT DOCUMENTS

| | | | | |
|---|---|---|---|---|
| 2014/0369527 A1* | 12/2014 | Baldwin | ............... | H03G 7/002 |
| | | | | 381/107 |
| 2015/0146886 A1* | 5/2015 | Baumgarte | .......... | H03G 3/3089 |
| | | | | 381/107 |
| 2018/0309421 A1 | 10/2018 | Smith et al. | | |
| 2019/0334496 A1* | 10/2019 | Park | ........................ | H04R 3/00 |
| 2020/0014355 A1* | 1/2020 | Henderson | ........... | H04N 21/812 |
| 2021/0288626 A1* | 9/2021 | Chung | ................. | H03G 3/3005 |
| 2022/0264160 A1* | 8/2022 | Jo | ...................... | H04N 21/6581 |
| 2023/0010609 A1* | 1/2023 | Binder | ..................... | H03G 3/02 |

FOREIGN PATENT DOCUMENTS

| KR | 10-2015-0122760 | 11/2015 |
|---|---|---|
| KR | 10-2016-0072255 | 6/2016 |

OTHER PUBLICATIONS

Written Opinion of the International Searching Authority for PCT/KR2021/017428 mailed on Mar. 8, 2022 and its English machine translation provided by Applicant's foreign counsel.

Office Action dated Apr. 11, 2024 for Korean Patent Application No. 10-2021-0163740 and its English translation provided by Applicant's foreign counsel.

White Paper on MPEG-D Dynamic Range Control, ISO/IEC JTC1/SC29/WG11N15071, Feb. 24, 2015.

Information technology—MPEG audio technologies—Part 4: Dynamic range control, ISO/IEC JTC1/SC29 N14744, Jul. 25, 2014.

\* cited by examiner

| Syntax | No. of bytes |
|---|---|
| loudnessDistribution() { | |
|   meta.loudDist.type; | 1 |
|   meta.loudDist.min = bsMin / 65535.0f * -90; | 2 |
|   meta.loudDist.max = bsMax / 65535.0f * -90; | 2 |
|   meta.loudDist.step = bsStep / 65535.0f * 90; | 2 |
|   meta.loudDist.numSteps; | 2 |
|   for (n=0; n<meta.loudDist.numSteps; n++) { | |
|     bsRatio = readFlexible(); | 1..5 |
|     meta.loudDist.ratio[n] = bsRatio / 65535.0f; | |
|   } } | |

Fig. 3

METHOD FOR PERFORMING NORMALIZATION OF AUDIO SIGNAL AND APPARATUS THEREFOR

CROSS-REFERENCE TO RELATED APPLICATIONS

This application claims the priority benefit of Korean Patent Application No. 10-2020-0159371, filed on Nov. 24, 2020 and Korean Patent Application No. 10-2020-0159372, filed on Nov. 24, 2020, each of which is hereby incorporated by reference herein in its entirety.

BACKGROUND OF THE INVENTION

Field of the Invention

The present disclosure relates to a method for normalizing an audio signal and a device therefor.

Description of the Prior Art

As methods for providing audio to a user have transitioned from analog to digital, the volume can be expressed in a wider range. In addition, according to the trend, the volumes of an audio signal are diversifying depending on the content corresponding to the audio signal. This is because, in the process of producing audio content, intended loudness may be set differently for each audio content. Accordingly, international standards groups such as the International Telecommunication Union (ITU) and the European Broadcasting Union (EBU) have issued standards for audio loudness. However, the method and the regulations for measuring loudness are different from country to country, and thus there is a problem that it is difficult to apply the standards issued by the international standards groups.

Content creators attempt to produce content with relatively large loudness mixed and provide it to users. This is due to the psychological acoustic characteristics that when the volume of the audio signal increases, the sound quality of the audio signal is perceived to be improved. Accordingly, there has been a competition called the loudness war. As a result, within the content or between multiple contents, a difference in loudness occurs, and the user may experience inconvenience of repeatedly controlling the volume of an apparatus in which the corresponding contents are played. Therefore, a technique for normalizing the loudness of audio content is required for the convenience of a user using a content playback apparatus.

SUMMARY OF THE INVENTION

An aspect of the present disclosure is to provide a method for consistently providing a target volume through normalization of loudness.

The present specification provides a method for normalizing loudness.

Specifically, a method for performing loudness normalization by an audio signal processing device includes: receiving an audio signal; receiving information relating to integrated loudness of the audio signal; receiving information relating to target loudness of the audio signal; obtaining a corrected integrated loudness by correcting the integrated loudness based on one or more audio processing, the integrated loudness is corrected based on one or more audio processing, the one or more audio processing including at least one of a dynamic range control (DRC) and a processing for changing a frequency domain spectrum of the audio signal; and obtaining a normalized audio signal by normalizing the audio signal based on the corrected integrated loudness and the target loudness.

In addition, in the present specification, the method performed by the audio signal processing device further includes receiving order information indicating an order in which the one or more audio processing for correction of the integrated loudness are applied.

In addition, in the present specification, the method performed by the audio signal processing device further includes receiving a bit flag indicating whether each of the one or more audio processing is activated, wherein the integrated loudness is corrected through the one or more audio processing which are activated based on the bit flag.

An audio signal processing device for performing loudness normalization includes: a receiver configured to receive an audio signal; and a processor configured to functionally control the receiver, wherein the processor is configured to receive information relating to integrated loudness of the audio signal, receive information relating to target loudness of the audio signal, obtain a corrected integrated loudness by correcting the integrated loudness based on one or more audio processing, the integrated loudness is corrected based on one or more audio processing, the one or more audio processing including at least one of a dynamic range control (DRC) and a processing for changing a frequency domain spectrum of the audio signal, and normalize the audio signal, based on the corrected integrated loudness and the target loudness, so as to obtain a normalized audio signal.

In addition, in the present specification, the processor receives order information indicating an order in which the one or more audio processing for correction of the integrated loudness are applied.

In addition, in the present specification, the processor receives a bit flag indicating whether each of the one or more audio processing is activated, and the integrated loudness is corrected through the one or more audio processing which are activated based on the bit flag.

In addition, in the present specification, the integrated loudness is corrected by applying the one or more audio processing according to an order determined based on the order information.

In addition, in the present specification, the order information is configured by a flag value identical to the bit flag.

In addition, in the present specification, the processing for changing the frequency domain spectrum of the audio signal includes at least one of an equalizer, a processing related to a characteristic of a user device, and a processing related to a recognition ability of a user.

In addition, in the present specification, the characteristic of the user device indicates a frequency band which the user device is able to output, and the recognition ability of the user indicates sensitivity of the user relative to a frequency band.

In addition, in the present specification, one of the one or more processing is a non-linear processing.

In addition, in the present specification, the non-linear processing is the DRC.

In addition, in the present specification, the normalization of the audio signal is performed based on a parameter related to a surrounding environment of a user, and the surrounding environment of the user is at least one of a size of a noise of a place where the user is located, and a frequency characteristic of the noise.

In addition, in the present specification, the target loudness is configured based on the parameter related to the surrounding environment of the user.

In addition, in the present specification, the number of the one or more audio processing is at least two.

Advantageous Effects

According to the present disclosure, efficient audio signals can be provided by standardizing target volumes through normalization of loudness.

BRIEF DESCRIPTION OF THE DRAWINGS

FIG. 3 illustrates a syntax of metadata including loudness distribution information according to an embodiment of the present disclosure.

DETAILED DESCRIPTION OF THE EXEMPLARY EMBODIMENTS

The terminology used in the present specification has been selected from among general terms widely used at present in consideration of the functions thereof in the present disclosure, but may vary according to the intention of a person skilled in the art, precedent, or the emergence of new technologies. In addition, in some cases, there may be terms arbitrarily selected by the applicant. In such a case, the meanings of the terms will be described in the corresponding description of the disclosure. Accordingly, the terms used in the present specification should be interpreted on the basis of the real meanings of the terms and the entire description of the present disclosure, rather than the names of simple terms.

Figure 1:
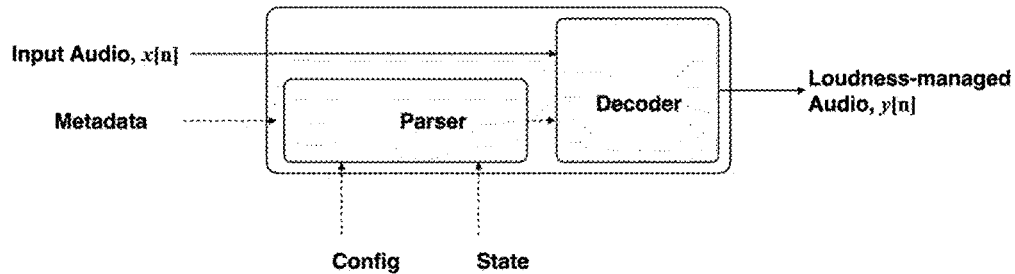
FIG. 1 is a block diagram illustrating an operation of an audio signal processing device according to an embodiment of the present disclosure.

FIG. 1 is a block diagram illustrating an operation of an audio signal processing device according to an embodiment of the present disclosure.

Referring to FIG. 1, an audio signal processing device may receive an input audio signal. In addition, the audio signal processing device may receive metadata corresponding to the input audio signal, and additionally receive configuration information (config and state) for the audio signal processing device. The metadata may indicate a syntax configuration element included in a bitstream received by the audio signal processing device.

The audio signal processing device may correct loudness of the input audio signal, based on the received input audio signal, metadata, configuration information, and the like, and may output, as an output audio signal, the corrected input audio signal. For example, the audio signal processing device may correct the loudness of the input audio signal to output a normalized audio signal.

Specifically, the audio signal processing device may include a parser and a decoder. The parser may calculate a deviation and a gain value for correction of the input audio signal by using the received metadata and configuration information. The decoder may correct the input audio signal, based on the input audio signal, the deviation, and the gain value, and output the corrected input audio signal. In other words, the decoder may perform a normalization processing process for the input audio signal, based on the input audio signal, the deviation, and the gain value, so as to output the normalized audio signal as an output signal. The deviation may indicate the difference in loudness between the input audio signal and the output audio signal.

Additionally, the audio signal processing device may control a dynamic range of an output loudness level of the normalized audio signal before outputting the normalized audio signal. This is because, when an output loudness level of a particular frame of input content deviates from a pre-configured dynamic range, sound quality may be distorted due to clipping. The audio signal processing device may control a dynamic range of an output loudness level, based on a pre-configured dynamic range. For example, the audio signal processing device may control a dynamic range of an output loudness level by using audio processing such as a dynamic range control (DRC) and a limiter.

Hereinafter, a method in which the audio signal processing device normalizes, based on a received input audio signal, metadata, and configuration information, an input audio signal will be described in detail. In addition, the normalization of an audio signal in the present specification may have the same meaning as the normalization of loudness.

The metadata may include information relating to integrated loudness, and information relating to target loudness. The integrated loudness may indicate an average volume of an input audio signal, and the target loudness may mean loudness of an output audio signal, that is, target loudness that the audio signal processing device is to output. The target loudness may be defined in a decibel scale having 0.1 dB resolution. In addition, loudness in the present specification may be expressed in a unit such as loudness K-weighted relative to full scale (LKFS) or loudness unit relative to full scale (LUFS).

The configuration information may include information relating to audio processing performed for normalization of an input audio signal. The audio processing performed for normalization may correspond to a device specific loudness control (DSLC), an equal loudness equalizer (ELEQ), an equalizer (EQ), and a dynamic range control (DRC). That is, the audio signal processing device may normalize an input audio signal by using at least one of the DSLC, ELEQ, EQ, and DRC. The information relating to audio processing performed for normalization may include information relating to the number of audio processing used for normalization, and an order in which the audio processing performed for normalization are applied. The information relating to an order may be a determined order of the audio processing applied for normalization of loudness. The predetermined order may be an order of four audio processing, that is, DSLC, ELEQ, EQ, and DRC. In a case where the number of audio processing is smaller than 4, the audio signal processing device may normalize an audio signal in consideration of order information with respect to only an audio processing actually used. For example, in a case where the order information indicates the order of DSLC→ELEQ→EQ→DRC, and only DSLC, EQ, and DRC are used for normalization of an audio signal, the audio signal processing device may normalize the audio signal, based on only order information of DSLC, EQ, and DRC. That is, even if there is the turn of ELEQ is included in the order information, the audio signal processing device may exclude the turn, and normalize the audio signal, based on the order of the remaining DSLC, EQ, and DRC, that is, the order of DSLC→EQ→DRC. In other words, the information indicating the number of audio processing used for normalization of an audio signal may be information indicating whether a corresponding audio processing is used. The audio signal processing device may identify that the audio processing for normalization of an audio signal are applied in the order of reception of information indicating whether each processing is used, and may normalize the audio signal according to the order. The information indicating whether an audio processing is used may have a bit flag type. The order information may be expressed using the same value as a bit flag value indicating whether an audio processing is used. In addition, the number of audio processing used for normalization of an audio signal may be at least two. EQ and DRC in the present specification may correspond to a processing performed inside the decoder of the input audio signal processing device, or may correspond to a processing performed outside the decoder.

EQ in the present specification may indicate a processing or an effector by which a process of changing a frequency characteristic of an input audio signal is performed. That is, a particular frequency band of an input audio signal may be emphasized or reduced through EQ processing. A dynamic range in the present specification indicates a range between a maximum value and a minimum value of an input audio signal measurement amount, and may be expressed in a decibel (dB) unit. DRC in the present specification may indicate a processing by which the volume of relatively large sound in an input audio signal is reduced, and the volume of relatively small sound is increased whereby the audio signal processing device can effectively output small sounds. DSLC in the present specification may indicate a processing by which an audio signal is processed to reflect an output (reproduction) characteristic of a reproduction device (e.g., a user device). For example, DSLC may correspond to a processing by which a function of excluding low band frequency signals which a reproduction device is unable to output (reproduce), and adjusting loudness is performed. Therefore, DSLC may correspond to a method of adjusting loudness of an audio signal through a band pass filter (e.g., a high-pass filter) according to an output (reproduction) characteristic (e.g., a case where output of a low band frequency signal is impossible) of a reproduction device in consideration of the output (reproduction) characteristic of the reproduction device before k-weighting used in loudness measurement is applied. ELEQ in the present specification may indicate a processing by which an audio signal is processed to reflect a user's recognition characteristic according to an output (volume) size of the audio signal. For example, ELEQ may correspond to EQ for compensation for a user's sensitivity changing relative to a high band or low band frequency region according to a change in a reproduction level in a case where the reproduction level is changed due to adjustment of the output (volume) of an audio signal. The user's sensitivity means a degree by which users feel different sound sizes according to frequencies even if the sounds has the same size, and may be expressed by an equal-loudness contour. That is, EQ, DSLC, and ELEQ may indicate a method for controlling a frequency spectrum of an input audio signal.

In addition, the audio signal processing device may receive (receive an input of) information related to a surrounding environment (i.e., listening environment) of a user (listener) who listens to an output audio signal, and normalize an input audio signal, based on the information related to the surrounding environment of the user. For example, the information related to the surrounding environment may indicate the noise size of the user's surrounding environment, a frequency characteristic of the noise, and a characteristic (e.g., indoor, outdoor, etc.) of the surrounding environment. That is, in a case where a noise level of the user's surrounding environment is high, the audio signal processing device may reduce a dynamic range and normalize the loudness of an input audio signal to output an audio signal suitable for the user. Specifically, the surrounding environment may indicate a user's surrounding environment for configuration of target loudness or a dynamic range enabling the user to ideally listen to an audio signal. For example, the information related to the surrounding environment may be set a parameter value for configuring at least one of the noise of the user's surrounding environment, the target loudness and a dynamic range.

Audio processing in the present specification may change a frequency domain spectrum of an input audio signal, and change the target loudness and the time region dynamic range of the input audio signal. The target loudness and the dynamic range may be changed based on the information related to the user's surrounding environment. As described above, the information related to the user's surrounding environment may be configured as a parameter value, and the audio signal processing device may normalize an input audio signal, based on the parameter value. Specifically, the audio signal processing device may change at least one of target loudness and a dynamic range, based on the parameter value, so as to normalize an audio signal.

In other words, the audio signal processing device may receive an input audio signal, information relating to integrated loudness, and information relating to target loudness, may apply audio processing to correct the integrated loudness, and normalize the input audio signal, based on the corrected integrated loudness and the target loudness. Thereafter, the audio signal processing device may output the normalized audio signal.

Figure 2:
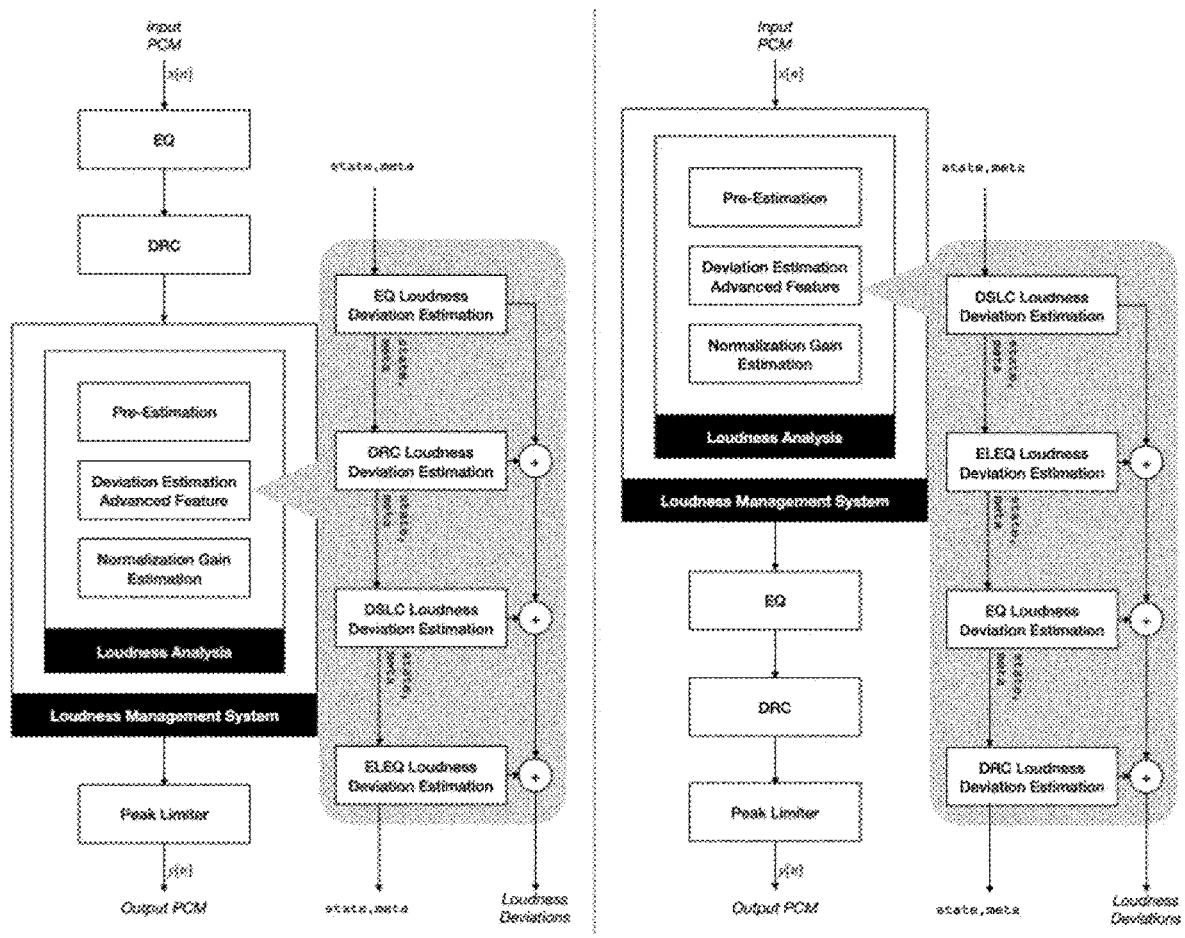
FIG. 2 illustrates methods for normalizing an audio signal according to an embodiment of the present disclosure.

FIG. 2A and FIG. 2B illustrate methods for normalizing an audio signal according to an embodiment of the present disclosure.

Methods for normalizing an audio signal by an audio signal processing device will be described in detail with reference to FIG. 2A and FIG. 2B.

A part of audio processing used for normalization of an audio signal may be non-linear. For example, DRC processing may be non-linear. Since non-linear processing affects loudness of an output audio signal, the audio signal processing device may normalize an audio signal by considering a loudness deviation, which is the deviation between a loudness signal of a non-linear processing output audio signal and loudness of a non-linear processing input audio signal, which are generated by non-linear processing. However, since, in a case of non-linear processing, an output signal is non-linearly processed unlike linear processing, it is not easy to predict the difference between the loudness of an input signal before non-linear processing is applied, and the loudness of an output signal. Accordingly, in a case where an audio signal processing device normalizes an audio signal, an order in which the audio processing are applied matters so that a loudness deviation generated due to non-linear processing can be efficiently predicted.

The audio signal processing device may predict a loudness deviation relative to four additional functions (e.g., EQ, DRC, DSLC, and ELEQ) related to the loudness of an audio signal, and use the predicted loudness deviation for loudness normalization. The audio signal processing device may receive, from the outside, an EQ frequency characteristic and a DRC gain characteristic to predict a loudness deviation.

Referring to FIG. 2A, EQ and DRC for loudness deviation prediction may be applied before "deviation estimation advanced feature". Referring to FIG. 2B, EQ and DRC for loudness deviation prediction may be applied after "deviation estimation advanced feature". "Deviation estimation advanced feature" illustrated in FIG. 2A and FIG. 2B is an audio processing used for normalization of an audio signal as described above, and may indicate a device specific loudness control (DSLC), an equal loudness equalizer (ELEQ), an equalizer (EQ), and a dynamic range control (DRC). That is, referring to FIG. 2A, EQ and DRC may be applied for normalization of an audio signal before the remaining audio processing (i.e., DSLC and ELEQ), and referring to FIG. 2B, EQ and DRC may be applied for normalization of an audio signal after the remaining audio processing (i.e., DSLC and ELEQ).

When the audio signal processing device performs normalization, non-linear processing may be applied to the audio signal. Specifically, the DRC processing described above may be applied. Since non-linear processing affects the loudness of the output audio signal, the audio signal processing device has to adjust the loudness of the audio signal considering a loudness deviation, which is a deviation of the loudness of the non-linear processing input audio signal and the loudness signal of the non-linear processing output audio signal, which may result from non-linear processing. However, in the case of the non-linear processing, the output signal is processed nonlinearly unlike linear processing, and thus it is difficult to predict the difference between the loudness of the input signal and the loudness of the output signal before the non-linear processing is applied. Therefore, when the audio signal processing device has to process an audio signal in real time, a method is required that is capable of efficiently predicting a loudness deviation caused by non-linear processing. To solve the above-mentioned problem, metadata including loudness distribution information of an audio signal included in the content may be used.

FIG. 3 illustrates a syntax of metadata including loudness distribution information according to an embodiment of the present disclosure.

As described above, the metadata used by the audio signal processing device may include information on loudness distribution. For convenience of description, the information on loudness distribution is referred to as loudness distribution information. In this case, the loudness distribution information may be a loudness histogram. Specifically, the loudness distribution information may be a normalized histogram. That is, the loudness distribution information may be a histogram configured in a normalized ratio in which a total sum of values corresponding to respective time intervals is 1. According to a specific embodiment, the metadata may include loudness distribution information indicating, for each of a plurality of steps separated according to a loudness magnitude, a ratio between an amount of an audio signal corresponding to each of the plurality of steps of the audio signal and a total amount of the audio signal. In this case, the loudness may be measured within a specified time interval. For example, the metadata may represent a ratio of the number of specified time intervals corresponding to each step to the total number of time intervals. For convenience of description, the ratio between the amount of the audio signal corresponding to each of the plurality of steps and the total amount of the audio signal is referred to as an audio signal ratio. Furthermore, the specified time interval may be a frame of the audio signal. The loudness distribution information may include information indicating a type of loudness, which serves as a reference. The type of loudness may be classified according to a length of a time interval in which the loudness is measured. For example, the type of loudness may represent at least one of the short-term loudness and the momentary loudness. Specifically, the loudness distribution information may have syntax as shown in FIG. 3.

In FIG. 3, "type" represents the type of loudness indicated by the loudness distribution information. As described above, the type of loudness may represent a type based on the length of a time interval in which the loudness of the loudness distribution information is measured. bsMin may represent a minimum value of the loudness coded in the loudness distribution information. bsMax may represent a maximum value of the loudness coded in the loudness distribution information. bsStep may represent the magnitude of the loudness step used in the loudness distribution information. numSteps may represent the total number of steps included in the loudness distribution information. bsRatio may represent a ratio between the amount of the audio signal corresponding to each of plurality of steps and the total amount of the audio signal in the loudness distribution information. Specifically, bsRatio may be a value representing a ratio between a value for each step and the sum of values for all steps in the loudness histogram. That is, bsRatio may be the audio signal ratio described above. A loudness distribution range may be −90 to 0 LUFS/LKFS.

The audio signal ratio for each step included in the loudness distribution information may be encoded as a variable-length bit string. This is because the difference in the audio signal ratio for each step may be large. Accordingly, when the audio signal ratio is encoded as a variable-length bit string, the loudness distribution information may be encoded with a much smaller number of bits than when the audio signal ratio is encoded as a fixed-length bit string. Specifically, the audio signal ratio corresponding to each of a plurality of steps may be included in one bit string. In this case, the bit string may include an ending flag repeatedly positioned by a predetermined number and indicating the last bit of bits representing the audio signal ratio corresponding to each step. Specifically, the ending flag may be repeatedly positioned every 8 bits. In addition, when the value of the ending flag is a predetermined value, the bit immediately before the ending flag may be the last bit of the audio signal ratio. In this case, the predetermined value may be 1.

In the specific embodiment, the audio signal processing device may process the bit string including the audio signal ratio for each step in units of 8 bits. The audio signal processing device obtains values of 7 bits, which is a part of 8 bits, as a part of bits indicating the audio signal ratio and obtains the last 1 bit as the ending flag. When the value of the ending flag is a predetermined value, bits representing the audio signal ratio are obtained by combining bits of the previously obtained audio signal ratio. When the value of the ending flag is not a predetermined value, the audio signal processing device obtains the next 8 bits and repeatedly performs the previously performed operation. The audio signal processing device may obtain the audio signal ratio from the bit stream including an audio signal component for each step according to the syntax of Table 1.

TABLE 1

| Syntax | No. of bytes |
|---|---|
| value = readFlexible( ) { | |
|   value = 0; | |
|   for (n=0: n<5: n++) { | |
|     byte: | 1 |
|     value += (0x7 & byte) << (7 * n); | |
|     if (!(0x80 & byte)) break; | |
|   } | |
|   return value; | |
| } | |

The audio signal processing device may adjust the loudness of the audio signal based on the loudness distribution information.

As described above, the audio signal processing device may perform non-linear processing on the audio signal. In this case, the audio signal processing device may predict a loudness deviation caused by the non-linear processing based on the loudness distribution information and information on the characteristics of the non-linear processing. In this case, the information on the characteristics of non-linear processing may include at least one of a frequency characteristic of non-linear processing and a gain characteristic of non-linear processing. For example, the information on the characteristics of the non-linear processing may include the frequency characteristics of the equalizer. In addition, the information relating to the non-linear characteristic may include a parameter (e.g., a DRC gain characteristic) related to DRC. The information relating to the non-linear characteristic may be received (input) by the audio signal processing device from the outside.

The audio signal processing device may correct the loudness of an audio signal, based on a loudness deviation generated by non-linear processing. Specifically, the audio signal processing device may correct the loudness by the difference between target loudness and a value obtained by adding a loudness deviation generated by non-linear processing to the loudness of the audio signal. The audio signal processing device may normalize an input audio signal, based on the corrected loudness.

According to an embodiment, the audio signal processing device may apply the non-linear processing before loudness adjusting. In addition, the audio signal processing device may apply the non-linear processing after loudness adjusting.

The audio signal processing device may obtain a loudness deviation caused by DRC based on a DRC mapping curve that maps the reference level of the DRC input signal and the reference level of the DRC output signal. The reference level may be an average level, a maximum level (peak value), or a loudness value that are calculated based on a certain section, which is expressed as a linear scale value or a log scale level of the input signal. When the integrated loudness of a DRC input audio signal input to the DRC is $L_I$ and the integrated loudness of an input audio signal input to the audio signal processing device is $L_{I,org}$, the loudness deviation $\Delta L_{prev}$ caused by other audio processing before DRC can be defined as follows. The DRC mapping curve may have a value between −127 and 0 dB.

$$\Delta L_{prev} = L_I - L_{I,org}$$

The audio signal processing device may adjust the loudness distribution of the input audio signal obtained from the loudness distribution information to the range of the loudness distribution input to the DRC by using $\Delta L_{prev}$, $L_{prev}$ may be 0 depending on the implementation of the audio signal processing device. Specifically, when the loudness distribution of the audio signal is defined at $-127 < \text{input}_{DB} < 0$, the audio signal processing device may adjust the range of the loudness distribution, $h_{DB}[k(\text{input}_{DB})]$ to $-127 + \Delta L_{prev} < \text{input}_{DB} < \Delta L_{prev}$. Specifically, the audio signal processing device may adjust the range of the loudness distribution of the audio signal to the range of the loudness distribution of the audio signal input to the DRC according to the following equation. That is, the audio signal processing device may perform DRC processing of the loudness distribution to generate a new loudness distribution input to DRC.

$$h_{DB,prev}[k(\text{input}_{DB})] = h_{DB}[k(\text{input}_{DB} - \Delta L_{prev})]$$

where $k(\text{input}_{DB}) = \text{round}(10\text{input}_{DB}) + 1270$ for $\forall \text{input}_{DB}$ in $[-27.0\ 0.0]$ The audio signal processing device may initialize hDB, DRC, which is the loudness distribution of the audio signal after DRC application, based on drcDB[K(inputDB)], which is the DRC mapping curve, from hDB,prev, which is obtained by adjusting the range of the distribution.

$$h_{DB,DRC}[k(drc_{DB}[k(\text{input}_{DB})])] \mathrel{+}= h_{DB,prev}[k(\text{input}_{DB})]$$

where $k(\text{input}_{DB}) = \text{round}(10\text{input}_{DB}) + 1270$ for $\forall \text{input}_{DB}$ in $[-127.0\ 0.0]$ The audio signal processing device may obtain the loudness, $L_{DRC,out}$ of the DRC output audio signal from $h_{DB,DRC}$, and may obtain the loudness deviation $\Delta L_{DRC}$ caused by the DRC therefrom. Specifically, according to ITU-R Recommendation BS.1770-4, the audio signal processing device may obtain, as the loudness $L_{DRC,out}$ of the DRC output audio signal, the average of the distribution above the average value of distribution components obtained by removing the components below the absolute threshold and a relative threshold, $J_O$, derived therefrom. For example, the audio signal processing device may obtain $\Delta L_{DRC}$ according to the following equation.

$$L_{DRC,out} = 10\log_{10}\left(\frac{L_j}{N_j}\right) - 0.691$$

where $L_j = \sum_{\text{input}_{DB}=J_0}^{UL} 10^{\frac{\text{input}_{Db}+0.691}{10}} h_{DB,DRC}[k(drc_{DB}[k(\text{input}_{DB})])]$, $$N_j = \sum_{\text{input}_{DB}=J_0}^{UL} h_{DB,DRC}[k(drc_{DB}[k(\text{input}_{DB})])],$$

$k(\text{input}_{DB}) = \text{round}(10\ \text{input}_{DB}) + 1270$ for $\forall\ \text{input}_{DB}$ in $[-127.0\ UL]$, $J_0$ is relative threshold, and $UL = 5$ $\Delta L_{dRC} = L_{DRB,out} - L_I$ In other words, the audio signal processing device may receive, from the outside, loudness distribution information and information (e.g., a parameter related to DRC) relating to a non-linear processing characteristic. The audio signal processing device may update (newly obtain) the loudness distribution information, based on the information relating to the non-linear processing characteristic. The audio signal processing device may normalize an input audio signal, based on the updated loudness distribution information, information relating to integrated loudness, and information relating to target loudness.

The audio signal processing device may multiply a gain value ($G_{loud}$) to the input audio signal to normalize the audio signal. The audio signal processing device may calculate the gain value to obtain an output audio signal coinciding with the target loudness. Various methods for normalizing an audio signal, based on a gain value will be described. The gain value may be calculated, based on target loudness ($L_T$) and integrated loudness ($L_I$).

i) The audio signal processing device may compensate for a deviation between the target loudness ($L_T$) and the integrated loudness ($L_I$). When LT is greater than $L_I$, the audio signal gain value is greater than 1, and thus clipping may occur, and a peak limiter may be applied to prevent clipping. The gain value may be calculated by the following equation.

$$G_{loud} = 10^{\left(\frac{L_T - L_I}{20}\right)}$$

ii) The audio signal processing device may calculate the gain value by using LQSHI, which is a maximum target loudness which can be provided without artifacts on a limiter included in metadata. Specifically, the gain value may be obtained based on the smaller value between $L_T$ and $L_{QSHI}$ as in the following equations. In the following equation, min(x, y) is a function of returning the smaller value between x and y.

$$L_{T,QSHI} = \min(L_T, L_{QSHI})$$

$$G_{loud} = 10^{\left(\frac{L_{T,QSHI} - L_I}{20}\right)}$$

iii) The audio signal processing device may calculate the gain value, based on a reference loudness value and an offset value for normalization of the audio signal. Specifically, the audio signal processing device may calculate an offset gain ($G_{offset}$), based on a reference loudness value ($L_{ref}$) and an offset value ($STLN_{offset}$) for normalization of the audio signal. The audio signal processing device may correct the offset value for normalization of the audio signal, and calculate the gain value, based on the corrected offset value. Detailed equations for calculating the gain value is as follows.

$$G_{offset} = \begin{cases} \left(\frac{18.0 + L_T}{10.0}\right)^{\frac{1}{3}} + \frac{0.25}{\sqrt{2 \cdot STLN_{offset}}}, & \text{for } L_T \geq -10 \text{ and } STLN_{offset} \neq 0 \\ \left(\frac{18.0 + L_T}{10.0}\right)^{\frac{1}{3}}, & \text{otherwise} \end{cases}$$

$$STLN'_{offset} = \begin{cases} 0, & \text{for } L_T - L_{Ref} < STLN_{th} \text{ or } L_T \leq L_I \\ STLN_{offset}, & \text{otherwise} \end{cases}$$

where $STLN_{th} = \frac{L_T + 10}{3}$ $$G_{loud} = 10^{\left(\frac{L_T - L_I + G_{offset} \cdot \sqrt{2 \cdot STLN'_{offset}}}{20}\right)}$$

iv) In a case where the audio signal processing device does not use a limiter to normalize the audio signal, the gain value may be calculated based on a sample peak value ($peak_{smpl}$). A detailed equation for calculating the gain value is as follows.

$$G_{loud} = \min\left(10^{\left(\frac{L_T - L_I}{20}\right)}, \frac{1.0f}{peak_{smpl}}\right)$$

v) In a case where the audio signal processing device does not use a limiter to normalize the audio signal, the gain value may be calculated based on a true peak value ($peak_{true}$). The true peak may precisely indicate a peak of an analog signal, which is impossible to measure by a sample peak meter. A detailed equation for calculating the gain value is as follows.

$$G_{loud} = \min\left(10^{\left(\frac{L_T - L_I}{20}\right)}, \frac{1.0f}{peak_{true}}\right)$$

vi) The audio signal processing device may normalize the audio signal by using only an attenuation gain. In a case where only the attenuation gain is used, the gain value may not exceed 1. A detailed equation for calculating the gain value is as follows.

$$G_{loud} = \min\left(10^{\left(\frac{L_T - L_I}{20}\right)}, 1\right)$$

The audio signal processing device may normalize an audio signal through all or some audio processing among EQ, DRC, DSLC, and ELEQ. In an embodiment, the audio signal processing device may normalize an audio signal by applying audio processing in the order of DSLC→ELEQ. That is, the audio signal processing device may normalize an audio signal by applying DSLC filtering and ELEQ filtering.

DSLC Filtering

A DSLC filter may be a filter for ensuring a signal dynamic range rather than a filter reflecting a frequency response of a user device. For example, a speaker of a mobile device does not have a favorable low-frequency characteristic, and thus the DSLC filter may be a low cut filter which removes a component of 100 Hz or lower. The DSLC filter may have a finite impulse response (FIR) type or an infinite impulse response (IIR) type.

In a case where the DSLC filter has a finite impulse response type, the audio signal processing device may apply finite impulse response filtering to an input audio signal ($x_{DSLC}[n]$), and output an output signal ($y_{DSLC}[n]$) to which the filtering has been applied. A detailed calculation method for the output signal is as in the following equation. NDSLC means a DSLC filter order for a user device, and $b_{DSLC}$ may be a numerator of a finite impulse response filter coefficient, which is a DSLC filter coefficient for a user device, and may have a float32 data type.

$$y_{DSLC}[n] = \sum_{k=0}^{N_{DSLC}} b_{DSLC}[k] x_{DSLC}[n-k]$$

In a case where the DSLC filter has an infinite impulse response type, the audio signal processing device may apply infinite impulse response filtering to an input audio signal ($x_{DSLC}[n]$), and output an output signal ($y_{DSLC}[n]$) to which the filtering has been applied. A detailed calculation method for the output signal is as in the following equation. NDSLC means a DSLC filter order for a user device, and $b_{DSLC}$ may be a numerator of an infinite impulse response filter coefficient, which is a DSLC filter coefficient for a user device, and may have a float32 data type. $a_{DSLC}$ may be a denominator of an infinite impulse response filter coefficient, which is a DSLC filter coefficient for a user device, and may have a float32 data type.

$$y_{DSLC}[n] = \frac{1}{a_{DSLC}[0]} \left( \sum_{k=0}^{N_{DSLC}} b_{DSLC}[k] x_{DSLC}[n-k] - \sum_{k=0}^{N_{DSLC}} a_{DSLC}[k] x_{DSLC}[n-k] \right)$$

Meanwhile, if the DSLC filter is not applied, DSLC processing may be bypassed, and the output signal ($y_{DSLC}[n]$) may be the same as the input audio signal ($x_{DSLC}[n]$).

ELEQ Filtering

An ELEQ filter may be a filter which corrects the difference between the timbre of an output audio signal, which is determined by target loudness ($L_T$) and a user volume ($L_{vol}$), and the timbre of a volume when a signal of an ELEQ reference loudness ($L_{ELEQ,ref}$) is 0 dB.

The audio signal processing device may perform infinite impulse response filtering of an input signal ($x_{ELEQ}[n]$) input to the ELEQ filter, by using a filter coefficient ($v_{DSLC}[n]$) according to a filter index ($i_{ELEQ}$) and may output a filtered output signal (yELEQ[n]). The output signal ($y_{ELEQ}[n]$) may be calculated as in the following equation. $b_{ELEQ}[i_{ELEQ}][k]$ is a value pre-configured according to the frequency of an input audio signal, and the frequency may be 44100 Hz or 48000 Hz. $x_{ELEQ}[n]$ may be the same as $y_{DSLC}[n]$.

$$y_{ELEQ}[n] = \sum_{k=0}^{60} b_{ELEQ}[i_{ELEQ}][k] x_{ELEQ}[n-k]$$

In a case where the ELEQ filter is not applied, ELEQ processing may be bypassed, and $y_{ELEQ}[n]$ may be the same as $x_{ELEQ}[n]$.

The audio signal processing device may output a normalized audio signal (y[n]), based on a gain value ($G_{loud}$) calculated by the method described above, and $y_{ELEQ}[n]$, which is output by performing ELEQ filtering. The normalized audio signal may be calculated as in the following equation.

$$y[n] = G_{loud} \cdot y_{ELEQ}[n]$$

Figure 4:
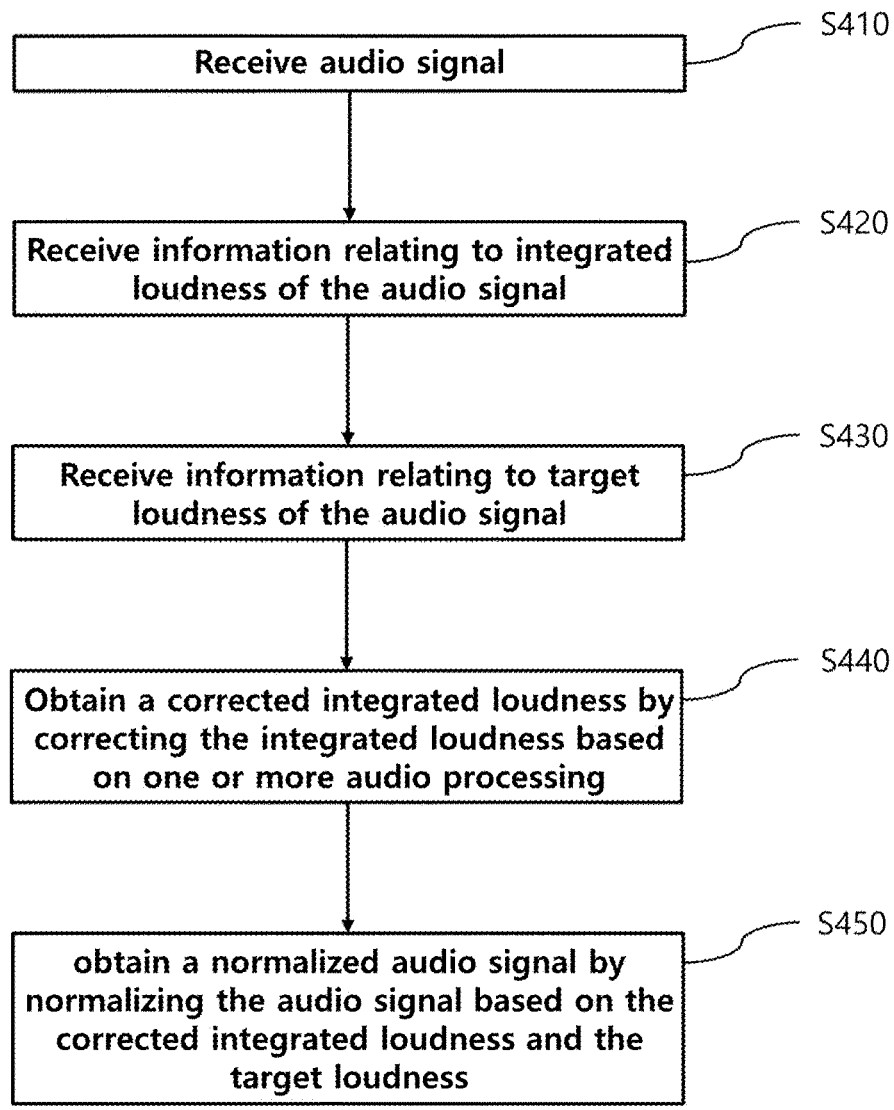
FIG. 4 is a flowchart illustrating a method for normalizing an audio signal according to an embodiment of the present disclosure.

FIG. 4 is a flowchart illustrating a method for normalizing an audio signal according to an embodiment of the present disclosure.

Referring to FIG. 4, an audio signal processing device may receive an audio signal (S410). The audio signal processing device may receive information relating to integrated loudness of the audio signal (S420). The audio signal processing device may receive information relating to target loudness of the audio signal (S430). The audio signal processing device may obtain a corrected integrated loudness by correcting the integrated loudness based on one or more audio processing (S440). The integrated loudness may be corrected based on one or more audio processing, and the one or more audio processing may include at least one of a dynamic range control (DRC) and a processing for changing a frequency domain spectrum of the audio signal. The audio signal processing device may obtain a normalized audio signal by normalizing the audio signal based on the corrected integrated loudness and the target loudness (S450).

The audio signal processing device may receive order information indicating an order in which the one or more audio processing for correction of the integrated loudness are applied. The integrated loudness may be corrected by applying the one or more audio processing according to an order determined based on the order information.

The audio signal device may receive a bit flag indicating whether each of the one or more audio processing is activated. The integrated loudness may be corrected through the one or more audio processing which are activated based on the bit flag. The order information may be configured by a flag value identical to the bit flag.

The processing for changing the frequency domain spectrum of the audio signal may include at least one of an equalizer, a processing related to a characteristic of a user device, and a processing related to a recognition ability of a user. The characteristic of the user device may indicate a frequency band which the user device is able to output. The recognition ability of the user may indicate sensitivity of the user relative to a frequency band. One of the one or more processing may be a non-linear processing. Specifically, the non-linear processing may be the DRC. The number of the one or more audio processing used for audio signal normalization may be at least two.

The normalizing of the audio signal may be performed based on a parameter related to a surrounding environment of a user. The surrounding environment of the user may be at least one of a size of a noise of a place where the user is located, and a frequency characteristic of the noise. The target loudness may be configured based on the parameter related to the surrounding environment of the user.

Figure 5:
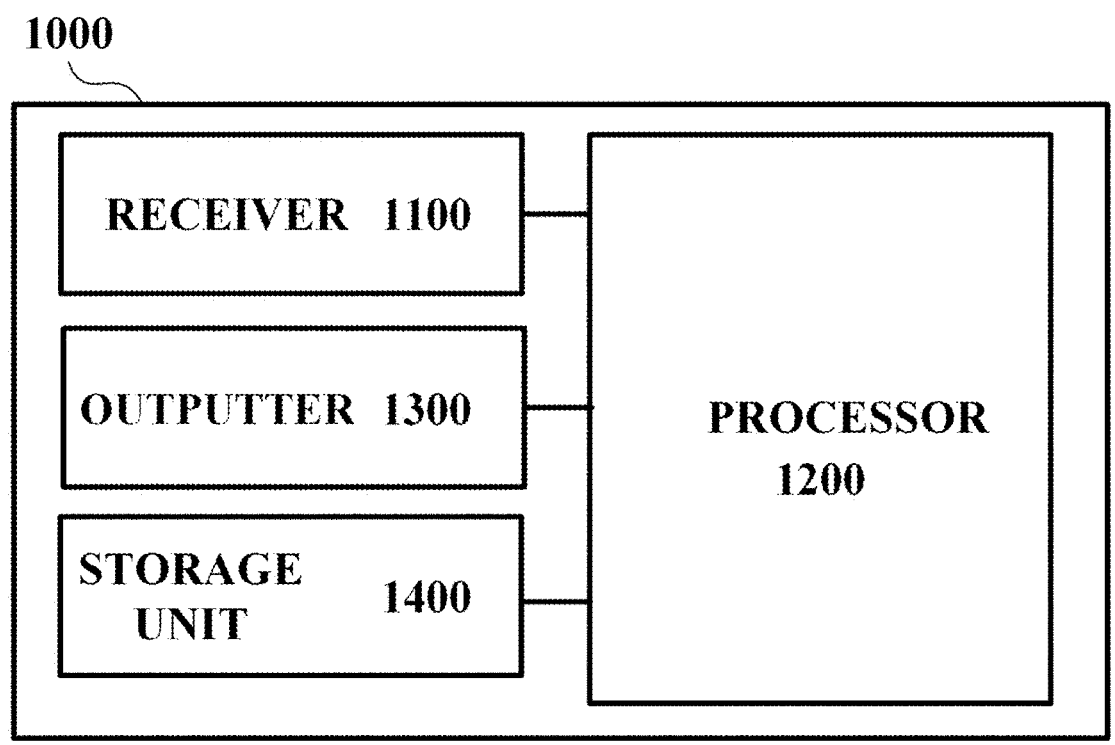
FIG. 5 is a block diagram illustrating a configuration of an audio signal processing device according to an embodiment of the present disclosure.

FIG. 5 is a block diagram illustrating a configuration of an audio signal processing device according to an embodiment of the present disclosure.

An audio signal processing device described with reference to FIG. 5 may be the audio signal processing device described with reference to FIG. 4. Specifically, the audio signal processing device may include a receiver which receives information related to an audio signal, and a processor which functionally controls the receiver. The processor may perform a method for normalizing an audio signal described with reference to FIG. 1 to FIG. 4.

According to an embodiment, the audio signal processing device 1000 may include a receiver 1100, a processor 1200, an outputter 1300, and a storage unit 1400. However, not all of the components illustrated in FIG. 7 are essential components of the audio signal processing device. The audio signal processing device 1000 may additionally include components not illustrated in FIG. 7. In addition, at least some of the components of the audio signal processing device 100 illustrated in FIG. 7 may be omitted. For example, the audio signal processing device according to an embodiment may not include the receiver 1100 and the outputter 1300.

The receiver 1100 may receive input audio signal input to the audio signal processing device 1000. The receiver 1100 may receive the input audio normalized by the processor 1200. Specifically, the receiver 1100 may receive input content from an external server through a network. Furthermore, the receiver 1100 may obtain the input audio signal from a storage medium. In this case, the audio signal may include at least one of an ambisonic signal, an object signal, or a channel signal. Furthermore, the audio signal may be one object signal or a mono signal. The audio signal may be a multi-object or multi-channel signal. According to an embodiment, the receiver 1100 may include an input terminal for receiving the input audio signal transmitted by wire. In addition, the receiver 1100 may include a wireless receiving module for receiving the input audio signal transmitted wirelessly.

According to an embodiment, the audio signal processing device 1000 may include a separate decoder. In this case, the receiver 1100 may receive an encoded bitstream corresponding to the input audio signal. In addition, the encoded bitstream may be decoded as the input content through a decoder. Additionally, the receiver 1100 may receive metadata related to the input audio signal.

According to an embodiment, the receiver 1100 may include a transmitter/receiver for transmitting and receiving data with an external device through a network. In this case, the data may include at least one of a bitstream or metadata of the input audio signal. The receiver 1100 may include a wired transmission/reception terminal for receiving data transmitted by wire. In addition, the receiver 1100 may include a wireless transmission/reception module for receiving data transmitted wirelessly. In this case, the receiver 1100 may receive data transmitted wirelessly using a Bluetooth or Wi-Fi communication method. Further, the receiver 1100 may receive data transmitted according to a mobile communication standard such as long-term evolution (LTE) and LTE-advanced, and the present disclosure is not limited thereto. The receiver 1100 may receive various types of data transmitted according to various wired and wireless communication standards.

The processor 1200 may control the overall operation of the audio signal processing device 100. The processor 1200 may control each component of the audio signal processing device 100. The processor 1200 may perform calculations and processing of various data and signals. The processor 1200 may be implemented as hardware in the form of a semiconductor chip or an electronic circuit, or may be implemented as software that controls hardware. The processor 1200 may be implemented in a form in which the hardware and the software are combined. For example, the processor 1200 may control operations of the receiver 1100, the outputter 1300, and the storage unit 1400 by executing at least one program. In addition, the processor 1200 may perform the operations described with reference to FIGS. 1 to 4 by executing at least one program.

According to an embodiment, the processor 1200 may normalize the input audio signal. For example, the processor 1200 may perform normalization of the input audio signal based on audio processing. In this case, the audio signal processing may include at least one of Device Specific Loudness Control (DSLC), Equal Loudness Equalizer (ELEQ), Equalizer (EQ), and Dynamic Range Control (DRC). In this case, any one of audio processing may be non-linear processing. Also, the processor 1200 may normalize the input audio signal by applying audio processing according to order information indicating the order in which the audio processing is applied. Also, the processor 1200 may output a normalized audio signal. In this case, the processor 1200 may output a normalized audio signal through an outputter 1300 to be described later.

The outputter 1300 may output a normalized audio signal. The outputter 1300 may output the normalized audio signal obtained by normalizing the input audio signal by the processor 1200. In this case, the output audio signal may include at least one of an ambisonic signal, an object signal, or a channel signal. The output audio signal may be a multi-object or multi-channel signal. In addition, the output audio signal may include a 2-channel output audio signal that corresponds to both ears of the listener, respectively. The output audio signal may include a binaural 2-channel output audio signal.

According to an embodiment, the outputter 1300 may include an outputter for outputting output content. For example, the outputter 1300 may include an output terminal for outputting an output audio signal to the outside. In this case, the audio signal processing device 100 may output an output audio signal to an external device connected to the output terminal. The outputter 1300 may include a wireless audio transmission module for outputting an output audio signal to the outside. In this case, the outputter 1300 may output an output audio signal to an external device using a wireless communication method such as Bluetooth or Wi-Fi.

In addition, the outputter 1300 may include a speaker. In this case, the audio signal processing device 100 may output an output audio signal through the speaker. In addition, the outputter 1300 may additionally include a converter (e.g., digital-to-analog converter (DAC)) for converting a digital audio signal into an analog audio signal. Additionally, the outputter 1300 may include a display for outputting a video signal included in the output content.

The storage unit 1400 may store at least one of data or programs for processing and controlling the processor 1200. For example, the storage unit 1400 may store various information (e.g., ELEQ filter coefficients, etc.) for performing audio processing. Furthermore, the storage unit 1400 may store a result calculated by the processor 1200. For example, the storage unit 1400 may store a signal after DSLC filtering is performed. In addition, the storage unit 1400 may store data input to the audio signal processing device 1000 or output from the audio signal processing device 1000.

The storage unit 1400 may include at least one memory. In this case, the memory may include at least one storage medium of a flash memory type memory, a hard disk type memory, a multimedia card micro type memory, a card type memory (for example, SD or XD memory), a random access memory (RAM), a static random access memory (SRAM), a read-only memory (ROM), an electrically erasable programmable read-only memory (EEPROM), a programmable read-only memory (PROM), a magnetic memory, a magnetic disk, and an optical disk.

Some embodiments may also be implemented in the form of a recording medium including instructions executable by a computer, such as a program module executed by a computer. The computer-readable media may be any available media that be accessible by a computer, and may include all volatile and nonvolatile media, and removable and non-removable media. Further, the computer-readable medium may include a computer storage medium. The computer storage media include all volatile and non-volatile medium, and removable and non-removable media implemented in any method or technology for storing information such as computer-readable instructions, data structures, program modules, or other data.

Although the present disclosure has been described above through specific embodiments, but those skilled in the art to which the present disclosure belongs can make modifications and changes without departing from the spirit and scope of the present disclosure. Therefore, what could be easily conceived by those skilled in the field upon reading the detailed description and embodiments of the present disclosure is to be construed as falling within the scope of the present disclosure.

What is claimed is:

1. A method for performing loudness normalization by an audio signal processing device, the method comprising:
   receiving an audio signal;
   receiving information relating to integrated loudness of the audio signal;
   receiving information relating to target loudness of the audio signal;
   obtaining a corrected integrated loudness by correcting the integrated loudness based on one or more audio processing,
   wherein the integrated loudness is corrected based on one or more audio processing,
   wherein the one or more audio processing includes at least one of a dynamic range control (DRC) and a processing for changing a frequency domain spectrum of the audio signal; and
   obtaining a normalized audio signal by normalizing the audio signal based on the corrected integrated loudness and the target loudness.

2. The method of claim 1, the method further comprising:
   receiving order information indicating an order in which the one or more audio processing for correction of the integrated loudness are applied.

3. The method of claim 2, wherein the integrated loudness is corrected by applying the one or more audio processing according to an order determined based on the order information.

4. The method of claim 2, the method further comprising:
   receiving a bit flag indicating whether each of the one or more audio processing is activated,
   wherein the integrated loudness is corrected through the one or more audio processing which are activated based on the bit flag.

5. The method of claim 4, wherein the order information is configured by a flag value identical to the bit flag.

6. The method of claim 1, wherein the processing for changing the frequency domain spectrum of the audio signal includes at least one of an equalizer, a processing related to a characteristic of a user device, and a processing related to a recognition ability of a user.

7. The method of claim 6, wherein the characteristic of the user device indicates a frequency band which the user device is able to output, and
   wherein the recognition ability of the user indicates sensitivity of the user relative to a frequency band.

8. The method of claim 6, wherein one of the one or more processing is a non-linear processing.

9. The method of claim 8, wherein the non-linear processing is the DRC.

10. The method of claim 1, wherein the normalizing of the audio signal is performed based on a parameter related to a surrounding environment of a user, and
    wherein the surrounding environment of the user is at least one of a size of a noise of a place where the user is located, and a frequency characteristic of the noise.

11. The method of claim 10, wherein the target loudness is configured based on the parameter related to the surrounding environment of the user.

12. The method of claim 6, wherein the number of the one or more audio processing is at least two.

13. An audio signal processing device for performing loudness normalization, the device comprising:
    a receiver configured to receive an audio signal; and
    a processor configured to functionally control the receiver,
    wherein the processor is configured to:
    receive information relating to integrated loudness of the audio signal,
    receive information relating to target loudness of the audio signal,
    obtain a corrected integrated loudness by correcting the integrated loudness based on one or more audio processing,
    wherein the integrated loudness is corrected based on one or more audio processing,
    wherein the one or more audio processing includes at least one of a dynamic range control (DRC) and a processing for changing a frequency domain spectrum of the audio signal, and
    obtain a normalized audio signal by normalizing the audio signal, based on the corrected integrated loudness and the target loudness, so as to obtain a normalized audio signal.

14. The device of claim 13, wherein the processor is configured to:
    receive order information indicating an order in which the one or more audio processing for correction of the integrated loudness are applied.

15. The device of claim 14, wherein the integrated loudness is corrected by applying the one or more audio processing according to an order determined based on the order information.

16. The device of claim 14, wherein the processor is configured to:
    receive a bit flag indicating whether each of the one or more audio processing is activated,
    wherein the integrated loudness is corrected through the one or more audio processing which are activated based on the bit flag.

17. The device of claim 16, wherein the order information is configured by a flag value identical to the bit flag.

18. The device of claim 13, wherein the processing for changing the frequency domain spectrum of the audio signal includes at least one of an equalizer, a processing related to a characteristic of a user device, and processing related to a recognition ability of a user.

19. The device of claim 18, wherein the characteristic of the user device indicates a frequency band which the user device is able to output, and
    wherein the recognition ability of the user indicates sensitivity of the user relative to a frequency band.

20. The device of claim 18, wherein one of the one or more processing is a non-linear processing.

* * * * *